(12) United States Patent
Bradford et al.

(10) Patent No.: US 8,304,161 B2
(45) Date of Patent: Nov. 6, 2012

(54) SILSESQUIOXANE RESINS

(75) Inventors: Michael L. Bradford, Midland, MI (US); Eric Scott Moyer, Midland, MI (US); Sheng Wang, Midland, MI (US); Craig Rollin Yeakle, Midland, MI (US)

(73) Assignee: Dow Corning Corporation, Midland, MI (US)

(*) Notice: Subject to any disclaimer, the term of this patent is extended or adjusted under 35 U.S.C. 154(b) by 196 days.

(21) Appl. No.: 12/919,039

(22) PCT Filed: Feb. 3, 2009

(86) PCT No.: PCT/US2009/032907
§ 371 (c)(1),
(2), (4) Date: Aug. 24, 2010

(87) PCT Pub. No.: WO2009/111122
PCT Pub. Date: Sep. 11, 2009

(65) Prior Publication Data
US 2011/0003249 A1    Jan. 6, 2011

Related U.S. Application Data

(60) Provisional application No. 61/033,495, filed on Mar. 4, 2008.

(51) Int. Cl.
| G03F 7/00 | (2006.01) |
| G03F 7/075 | (2006.01) |
| G03F 7/40 | (2006.01) |
| C08G 77/00 | (2006.01) |
| C08G 77/12 | (2006.01) |

(52) U.S. Cl. ............ 430/270.1; 430/322; 430/330; 430/331; 430/913; 528/10; 528/31; 528/41; 528/43

(58) Field of Classification Search ........... 430/270.1, 430/271.1, 322, 331, 330, 913; 528/10, 25, 528/30, 43, 31, 41
See application file for complete search history.

(56) References Cited

U.S. PATENT DOCUMENTS

| 4,587,138 A | 5/1986 | Yau et al. |
| 5,010,159 A | 4/1991 | Bank et al. |
| 5,100,503 A | 3/1992 | Allman et al. |
| 5,210,168 A | 5/1993 | Bergstrom et al. |
| 5,412,053 A | 5/1995 | Lichtenhan et al. |
| 5,422,223 A | 6/1995 | Sachdev et al. |
| 5,441,765 A | 8/1995 | Ballance et al. |
| 5,484,867 A | 1/1996 | Lichtenhan et al. |
| 5,589,562 A | 12/1996 | Lichtenhan et al. |
| 5,691,396 A | 11/1997 | Takemura et al. |
| 5,708,099 A | 1/1998 | Kushibiki et al. |
| 5,762,697 A | 6/1998 | Sakamoto et al. |
| 5,891,529 A | 4/1999 | Harkness et al. |
| 6,057,239 A | 5/2000 | Wang et al. |
| 6,087,064 A | 7/2000 | Lin et al. |
| 6,143,855 A | 11/2000 | Hacker et al. |
| 6,156,640 A | 12/2000 | Tsai et al. |
| 6,177,143 B1 | 1/2001 | Treadwell et al. |
| 6,268,457 B1 | 7/2001 | Kennedy et al. |
| 6,281,285 B1 | 8/2001 | Becker et al. |
| 6,329,118 B1 | 12/2001 | Hussein et al. |
| 6,340,734 B1 | 1/2002 | Lin et al. |
| 6,344,284 B1 | 2/2002 | Chou |
| 6,359,096 B1 | 3/2002 | Zhong et al. |
| 6,365,765 B1 | 4/2002 | Baldwin et al. |
| 6,368,400 B1 | 4/2002 | Baldwin et al. |
| 6,395,397 B2 | 5/2002 | Hong et al. |
| 6,420,084 B1 | 7/2002 | Angelopoulos et al. |
| 6,420,088 B1 | 7/2002 | Angelopoulos et al. |
| 6,424,039 B2 | 7/2002 | Wang et al. |
| 6,461,955 B1 | 10/2002 | Tsu et al. |
| 6,503,692 B2 | 1/2003 | Angelopoulos et al. |
| 6,506,497 B1 | 1/2003 | Kennedy et al. |
| 6,515,073 B2 | 2/2003 | Sakamoto et al. |
| 6,576,681 B2 | 6/2003 | Zampini et al. |
| 6,589,711 B1 | 7/2003 | Subramanian et al. |
| 6,589,862 B2 | 7/2003 | Wang et al. |

(Continued)

FOREIGN PATENT DOCUMENTS
EP    1197511    4/2002
(Continued)

OTHER PUBLICATIONS

Drylie, Ewan et al., Synthesis and Crystal Structures of Bromo- and Ester-Functionalised Polyhedral Silsesquioxanes, Polyhedron, Mar. 6, 2006, vol. 25, pp. 853-858.

Feher, Frank J. et al. A General Strategy for Synthesizing Cubeoctameric Silsesquioxanes Containing Polymerizable Functional Groups. Main Group Chemistry. May 1998, vol. 2, Issue 3, pp. 169-181, ISSN 1024-1221.

J. Am. Chem. Soc. 1991, 113, 4303 by J. F. Cameron and J.M.J. Frechet.

Kennedy et al., An Anthraacene-Organosiloxane Spin on Antireflective Coating for KrF Lithography, Advances in Resist Technology and Processing XX, Theodore H. Fedynshyn, Editor, Proceedings of SPIE vol. 5039, 2003, 144-151.

(Continued)

Primary Examiner — Amanda C. Walke
(74) Attorney, Agent, or Firm — Erika Takeuchi; Sharon K. Brady

(57) ABSTRACT

A silsesquioxane resin comprised of the units $(Ph(CH_2)_rSiO_{(3-x)/2}(OR')_x)_m$, $(HSiO_{(3-x)/2}(OR')_x)_n$, $(MeSiO_{(3-x)/2}(OR')_x)_o$, $(RSiO_{(3-x)/2}(OR')_x)_p$, $(R^1SiO_{(3-x)/2}(OR')_x)_q$ where Ph is a phenyl group, Me is a methyl group; R' is hydrogen atom or a hydrocarbon group having from 1 to 4 carbon atoms; R is selected from an aryl sulfonate ester group; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.05 to 0.5; q has a value of 0 to 0.5; and m+n+o+p+q=1.

48 Claims, No Drawings

U.S. PATENT DOCUMENTS

| | | | |
|---|---|---|---|
| 6,596,405 B2 | 7/2003 | Zampini et al. | |
| 6,599,951 B2 | 7/2003 | Zampini et al. | |
| 6,605,362 B2 | 8/2003 | Baldwin et al. | |
| 6,730,454 B2 | 5/2004 | Pfeiffer et al. | |
| 6,746,530 B2 | 6/2004 | Wang | |
| 6,824,879 B2 | 11/2004 | Baldwin et al. | |
| 6,924,346 B2 | 8/2005 | Boisvert et al. | |
| 6,956,097 B2 | 10/2005 | Kennedy et al. | |
| 6,969,753 B2 | 11/2005 | Baldwin et al. | |
| 6,982,006 B1 | 1/2006 | Boyers et al. | |
| 7,012,125 B2 | 3/2006 | Kennedy et al. | |
| 7,202,013 B2 | 4/2007 | Ogihara et al. | |
| 7,294,732 B2 | 11/2007 | Ohno et al. | |
| 7,368,173 B2 | 5/2008 | Zhong et al. | |
| 7,393,911 B2 | 7/2008 | Noda | |
| 7,756,384 B2 * | 7/2010 | Fu et al. | 385/141 |
| 7,833,696 B2 * | 11/2010 | Fu et al. | 430/325 |
| 8,025,927 B2 * | 9/2011 | Fu et al. | 427/387 |
| 8,178,284 B2 * | 5/2012 | Kohno et al. | 430/311 |
| 2001/0036998 A1 | 11/2001 | Sakamoto et al. | |
| 2002/0025495 A1 | 2/2002 | Ogata et al. | |
| 2002/0042020 A1 | 4/2002 | Gallagher et al. | |
| 2002/0055000 A1 | 5/2002 | Kennedy et al. | |
| 2002/0065331 A1 | 5/2002 | Zampini et al. | |
| 2002/0095018 A1 | 7/2002 | Baldwin et al. | |
| 2002/0128388 A1 | 9/2002 | Kennedy et al. | |
| 2002/0187422 A1 | 12/2002 | Angelopoulos et al. | |
| 2002/0195419 A1 | 12/2002 | Pavelcheck | |
| 2002/0198269 A1 | 12/2002 | Zampini et al. | |
| 2003/0022953 A1 | 1/2003 | Zampini et al. | |
| 2003/0120018 A1 | 6/2003 | Baldwin et al. | |
| 2003/0199659 A1 | 10/2003 | Baldwin et al. | |
| 2003/0209515 A1 | 11/2003 | Pavelchek | |
| 2005/0245717 A1 | 11/2005 | Kennedy et al. | |
| 2005/0282090 A1 | 12/2005 | Hirayama et al. | |
| 2005/0288468 A1 | 12/2005 | Ohno et al. | |
| 2006/0021964 A1 | 2/2006 | Hirayama et al. | |
| 2006/0089478 A1 | 4/2006 | Noda | |
| 2006/0269724 A1 | 11/2006 | Ohashi et al. | |
| 2007/0022909 A1 | 2/2007 | Kennedy et al. | |
| 2007/0025678 A1 | 2/2007 | Kushibiki et al. | |
| 2007/0212886 A1 * | 9/2007 | Uh et al. | 438/706 |
| 2007/0298349 A1 | 12/2007 | Zhang et al. | |
| 2008/0014335 A1 | 1/2008 | Fu et al. | |
| 2008/0318436 A1 | 12/2008 | Fu et al. | |
| 2011/0233489 A1 * | 9/2011 | Fu et al. | 252/582 |
| 2011/0236835 A1 * | 9/2011 | Fu et al. | 430/315 |
| 2011/0301269 A1 * | 12/2011 | Fu et al. | 524/317 |

FOREIGN PATENT DOCUMENTS

| | | |
|---|---|---|
| EP | 1197998 | 4/2002 |
| JP | 06-56560 | 3/1994 |
| JP | 09221630 | 8/1997 |
| JP | 2002338690 | 11/2002 |
| JP | 2002356617 | 12/2002 |
| WO | WO 00/77575 | 12/2000 |
| WO | WO 02/06402 | 1/2002 |
| WO | WO 03/044079 | 3/2003 |
| WO | WO 03/044077 | 5/2003 |
| WO | WO 03/044078 | 5/2003 |
| WO | WO 03/044600 | 5/2003 |
| WO | WO 03/089992 | 10/2003 |
| WO | WO 2004/007192 | 1/2004 |
| WO | WO 2004/044025 | 5/2004 |
| WO | WO 2004/046224 | 6/2004 |
| WO | WO 2004/051376 | 6/2004 |
| WO | WO 2004/090965 | 10/2004 |
| WO | WO 2004/113417 | 12/2004 |
| WO | WO 2005/005235 | 1/2005 |
| WO | WO 2005/034236 | 4/2005 |
| WO | WO 2005/034677 | 4/2005 |
| WO | WO 2005/035236 | 4/2005 |
| WO | WO 2006/019468 | 2/2006 |
| WO | WO 2006/065310 | 6/2006 |
| WO | WO 2006/065316 | 6/2006 |
| WO | WO 2006/065320 | 6/2006 |
| WO | WO 2006/065321 | 6/2006 |
| WO | WO 2007/094848 | 8/2007 |
| WO | WO 2007/094849 | 8/2007 |
| WO | WO 2009/088600 | 7/2009 |
| WO | WO 2009/091440 | 7/2009 |
| WO | WO 2009/111121 | 9/2009 |
| WO | WO 2010/068336 | 6/2010 |

OTHER PUBLICATIONS

Kennedy et al., Organosiloxane based Bottom Antireflective Coatings for 193nm Lithography, Advances in Resist Technology and Processing XX, Theodore H. Fedynyshyn, Editor, Proceedings of SPIE vol. 5039, 2003, 929-939.

Polym. Eng. Sci 1992, 32, 1462 by J. V. Crivello.

Rahimian, Kamyar et al., Soluble, High Molecular Weight Polysilsesquioxanes with Carboxylate Functionalities, Macromolecules, Mar. 26, 2002, vol. 35, pp. 2452-2454.

Schiavone et al., SiON based antireflective coating for 193nm lithography, Part of the SPIE Conference on Advances in Resist Technology and Processing XVI, SPIE vol. 3678, Mar. 1999, 391-395.

J. Polym Sci 1999, 37, 4241 by J.V. Crivello.

Xu, Hui et al., Synthesis and Characterization of Oligomeric Silsesquioxane with Pendent Carboxylic Acid Groups, European Polymer Journal, Dec. 2001, vol. 37, pp. 2397-2405.

Tsunooka et al., J. Photopolym. Sci. Technol., vol. 19, No. 1, 2006, pp. 65-71.

Ito et al., Can. J. Chem. 73: 1924-1932 (1995).

King Industries Specialty Chemicals, K-Pure® High Performance Additives for Electronic Chemical Systems.

* cited by examiner

SILSESQUIOXANE RESINS

CROSS-REFERENCE TO RELATED APPLICATIONS

This application is a U.S. national stage filing under 35 U.S.C. §371 of PCT Application No. PCT/US09/32907 filed on 3 Feb. 2009, currently pending, which claims the benefit of U.S. Provisional Patent Application No. 61/033,495 filed 4 Mar. 2008 under 35 U.S.C. §119 (e). PCT Application No. PCT/US09/32907 and U.S. Provisional Patent Application No. 61/033,495 are hereby incorporated by reference.

BACKGROUND OF THE INVENTION

Antireflective coatings (ARC) are one of the essential materials used in microlithographic process. Typical ARC materials are expected to offer at least one of the following advantages: controlling line width by reducing swing curve; reducing standing wave reduction, planarization, minimizing reflective notching. As the patterning feature size shrinks to sub-65 nm in the microelectronic industry, tremendous challenges for new materials have been confronted to the materials industry. Among one of them is the 193 nm antireflective coatings (ARC), because the 193 nm photoresists have a very thin layer in order to get the right depth of focus and resolution and do not offer sufficient light absorption and etch resistance. There are three different types of materials for 193 nm ARC applications: inorganic, organic, and silicon-based materials. Inorganic based materials generally contain silicon oxynitride (Si—O—N), silicon nitride (Si—N), and silicon carbide. Because they are oxidized into silicon dioxide in oxygen plasma, these inorganic based materials have excellent oxygen etch resistance. However, because these materials are produced using chemical vapor deposition (CVD), they can not be used for patterning planarization. In addition, typically, these materials cannot be removed with typical etchants unless a harsh etching condition is used. Thus, they are generally retained in a device. On the other hand, the organic based ARC materials are spin-on based materials and thus can be used for patterning planarization. They are reworkable with typical etchants. However, they do not offer high oxygen etch resistance. Moreover, because photoresists and organic ARC materials are both organic materials, organic ARC materials do not offer $CF_x$ plasma based etch selectivity required for stripping off ARC layer. The silicone based ARC materials are silicon based spin-on materials. They are expected to have advantages of both CVD and organic ARC materials.

There are many challenges for making Si based ARC materials. The materials need to have appropriate refractive index (n) and coefficient of absorption (k) at 193 nm to match with the photoresist. The materials need to be curable in 1 min by UV or heating at temperatures lower than 250° C. for fast turn around processing. The material needs to be compatible with photoresist but no intermixing and/or diffusion occur(s) so that no scum and footing appear in a device with a small feature size. Further, the material needs to be resistant to propylene glycol methyl ether acetate (PGMEA), other typically photoresist solvents, and bases such as tetramethyl ammonium hydroxide (TMAH) after cure so that the thin film can withstand later processes. The film also needs to be reworkable for removal of the materials. Finally, the materials must be very stable at room temperature for at least three month with no significant molecular weight growth.

Si—H containing materials are essentially base and HF buffer solution soluble and thus the Si—H containing materials used for ARC applications are potentially reworkable. Si—H containing silsesquioxane resin such as $T^H T^{Me}$ and $T^H T^{Ph}$ can be cured at low temperature and Si—H containing silsesquioxane resins such as $T^H T^{Me} T^{Ph} T^R$ where R is a polyether group or an ester group, have potential as antireflective coating materials. Desirable properties in ARC resins include being polar to have better compatibility with a photoresist and an organic carbon underlayer, having a silicon content >30 wt % in order to get high oxygen plasma etch resistance and high $CF_x$ plasma etch selectivity and the functional groups on the resin need to be relatively small to mitigate the outgassing problems and porosity problems. It has now been found that resins that have an aryl sulfonate ester group are useful in ARC applications.

BRIEF SUMMARY OF THE INVENTION

This invention pertains to silsesquioxane resins useful in antireflective coatings wherein the silsesquioxane resin is comprised of the units

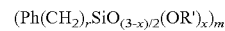

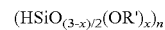

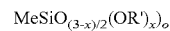

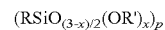

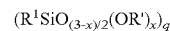

where Ph is a phenyl group, Me is a methyl group; R' is hydrogen atom or a hydrocarbon group having from 1 to 4 carbon atoms; R is selected from an aryl sulfonate ester group and a mixture of an aryl sulfonate ester group and the equivalent aryl sulfonic acid group with the proviso that in the mixture the majority of R are aryl sulfonate ester groups; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.025 to 0.5; q has a value of 0 to 0.5; and m+n+o+p+q≈1. When these resins are used in antireflective coatings, they provide good low temperature curability and reasonable TMAH resistance. In addition, the presence of a $(HSiO_{3/2})$ unit in the silsesquioxane resin is essential for the desired cure properties and strip-ability as a 193 nm ARC material. Additionally, these resins when used in ARC coatings provide outstanding optical, mechanical and etch electivity properties while being applicable using spin-on application techniques.

DETAILED DESCRIPTION OF THE INVENTION

The silsesquioxane resins useful in forming the antireflective coating are comprised of the units

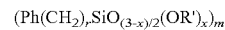

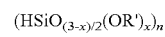

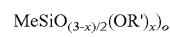

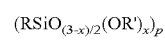

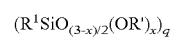

where Ph is a phenyl group, Me is a methyl group; R' is hydrogen atom or a hydrocarbon group having from 1 to 4 carbon atoms; R is selected from an aryl sulfonate ester group and a mixture of an aryl sulfonate ester group and the equivalent aryl sulfonic acid group with the proviso that in the mixture the majority of R are aryl sulfonate ester groups; and $R^1$ is selected from substituted phenyl groups, ester groups, polyether groups, mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.25 to 0.95; p has a value of 0.025 to 0.5; q has a value of 0 to 0.5; and m+n+o+p+q≈1 (where m, n, o, p and q) are mole fractions. Typically m has a value of 0 to 0.25, alternatively 0.0 to 0.10, alternatively >0 to 0.10. Typically n has a value of 0.15 to 0.40, alternatively 0.15 to 0.3. Typically o has a value of 0.25 to 0.80, alternatively 0.40 to 0.75. Typically p has a value of 0.025 to 0.20, alternatively 0.03 to 0.15. Typically q has a value of 0 to 0.2, alternatively 0 to 0.15, alternatively >0 to 0.15. Other silicone units such as $SiO_{4/2}$ may also be present in the resin.

R' is independently a hydrogen atom or hydrocarbon group having 1 to 4 carbon atoms. R' may be exemplified by H, methyl, ethyl, propyl, iso-propyl, n-butyl, and tert-butyl.

In the resin R is an aryl sulfonate ester group represented by the formula $R^2O$—$SO_2$-Ph-$(CH_2)_r$— where $R^2$ is, an aliphatic or an aromatic hydrocarbon group having 1 to 10 carbon atoms and r is as defined above. $R^2$ may be exemplified by, but not limited to, $(CH_3)_2CH_2$—, $CH_3$—$CH_3CH_2$—$CH_3CH_2CH_2$—, $(CH_3)_3C$—, $(CH_3)_2CH_2CH_2$— and others. Because of contaminants in the materials used to produce the silane having a sulfonate ester group and the side reaction during resin preparation, R may also be equivalent aryl sulfonic acid group (i.e. HO—$SO_2$-Ph-$(CH_2)_r$—). Aryl sulfonate ester groups may be exemplified by, but not limited to, $(CH_3)_2CHO$—$SO_2$-Ph-$(CH_2)_r$—, $CH_3CH_2O$—$SO_2$-Ph-$(CH_2)_r$—, $CH_3O$—$SO_2$-Ph-$(CH_2)_r$—, $(CH_3)_3CO$—$SO_2$-Ph-$(CH_2)_r$—, $CH_3CH_2CH_2CH_2O$—$SO_2$-Ph-$(CH_2)_r$— and others.

$R^1$ is selected from substituted phenyl groups, ester groups, polyether groups; mercapto groups, and reactive or curable organic functional groups. Substituted phenyl groups contain at least one HO—, MeO—, Me—, Et—, Cl—, and/or other substituents. Ester groups may be any organic substituent containing at least one ester functionality. Examples of ester groups useful herein are —$(CH_2)_2$—O—C(O)Me and —$(CH_2)_2$—C(O)—OMe. Polyether groups are an organic substituent having hydrocarbon units linked through oxygen atom, represented, but not limited by the following structure: —$(CH_2)_a[O(CH_2CH_2)_b]_cOR'$, or: —$(CH_2)_a[O(CH_2CH(CH_3))_b]_cOR'$, wherein a=2 to 12; b=1 to 6; c=2 to 200; R'=H, —C(O)$CH_3$, alkyl, or other organic groups. Examples of polyether groups useful herein are —$(CH_2)_3$—$(OCH_2CH_2)_c$—OMe, —$(CH_2)_3$—$(OCH_2CH_2)_c$—OH and —$(CH_2)_3$—$(OCH_2CH_2)_7$—OAc and —$(CH_2)_3$—$(OCH_2CH_2)_c$—OC(O)Me, and —$(CH_2)_3[O(CH_2CH(CH_3))]_cOH$, —$(CH_2)_3[O(CH_2CH(CH_3))]_cOCH_3$. Mercapto groups have the general formula HS$(CH_2)_r$— where r is as described above. Examples of mercapto groups are mercaptopropyl, mercaptoethyl, and mercaptomethyl. Reactive or curable organic functional groups may be exemplified by, but not limited to alkenyl groups such as vinyl and allyl; epoxy groups such as glycidoxypropyl group and epoxycyclohex group, acrylate groups such as methacryoxypropyl groups, acryloxypropyl, and others.

The typical method for producing the silsesquioxane resin involves the hydrolysis and condensation of the appropriate silanes. By this method it is possible that residual —OH and/or —OR' will remain in the silsesquioxane resin as a result of incomplete hydrolysis or condensation. If the total amount of units in the silsesquioxane resin containing —OR' groups, exceed 40 mole % then gellation and instability of the resin may occur. Typically the silsesquioxane resin contains 6 to 38 mole % of units containing —OR' groups, alternatively less than 5 mole %, alternatively less than 1 mole %.

The silsesquioxane resin has a weight average molecular weight (Mw) in the range of 500 to 200,000 alternatively in the range of 500 to 100,000, alternatively in the range of 700 to 30,0000 as determined by gel permeation chromatography employing RI detection and polystyrene standards.

The method for preparing a siloxane resin comprises reacting water, $HSiX_3$, $MeSiX_3$, $RSiX_3$, and optionally $Ph(CH_2)_rSiX_3$ and/or $R^1SiX_3$ in an organic solvent, where X is a hydrolyzable group independently selected from Cl, Br, $CH_3CO_2$—, an alkoxy group —OR', or other hydrolyzable groups. The silanes useful herein can be exemplified by, but not limited to, $HSi(OEt)_3$, $HSiCl_3$, $PhCH_2CH_2SiCl_3$, and $PhSiCl_3$, $MeSi(OMe)_3$, $MeSiCl_3$, $R^2O$—$SO_2$-Ph-$(CH_2)_r$—$SiCl_3$, $R^2O$—$SO_2$-Ph-$(CH_2)_r$—$Si(OME)_3$, $R^1SiCl_3$ and $R^1Si(OMe_3)_3$ where $R^1$ is as defined above, Me represents a methyl group, Et represents an ethyl group and Ph represents a phenyl group.

The silane containing an aryl sulfonate ester group can also be produced in situ during the reaction to produce the resin by using a silane having the general formula X—$SO_2$-Ph-$(CH_2)_r$—$SiX_3$ and an alcohol of the general formula ROH where X, r and R are as described above. For example, Cl—$SO_2$-Ph-$(CH_2)_r$—$SiX_3$ and an alcohol such as isopropanol, methanol, ethanol or t-butylanol may be added to the reaction mixture resulting in the formation of R—$SO_2$-Ph-$(CH_2)_r$—$SiX_3$ which then hydrolyzes and condenses with the other silanes to produce the silsesquioxane resin.

The silsesquioxane resin is typically produced in the presence of a solvent. Any suitable organic or silicone solvent that does not contain a functional group which may participate in the hydrolysis and/or condensation reaction may be used in producing the silsesquioxane resin. The solvent is generally used in an amount of 40 to 98 weight percent based on the total weight of solvent and silane reactants, alternatively 70 to 90 weight percent. The reaction may be carried out as a dual phase or single-phase system.

Useful organic solvents may be exemplified by, but not limited to, saturated aliphatics such as n-pentane, hexane, n-heptane, and isooctane; cycloaliphatics such as cyclopentane and cyclohexane; aromatics such as benzene, toluene, xylene, mesitylene; ethers such as tetrahydrofuran, dioxane, ethylene glycol diethyl ether, ethylene glycol dimethyl ether; ketones such as methylisobutyl ketone (MIBK) and cyclohexanone; halogen substituted alkanes such as trichloroethane; halogenated aromatics such as bromobenzene and chlorobenzene; esters such as propylene glycol monomethyl ether acetate (PGMEA), isobutyl isobutyrate and propyl propionate. Useful silicone solvents may be exemplified by, but not limited to cyclic siloxanes such as octamethylcyclotetrasiloxane, and decamethylcyclopentasiloxane. A single solvent may be used or a mixture of solvents may be used.

The reaction to produce the silsesquioxane resin can be carried out at any temperature so long as it does not cause significant gellation or cause curing of the silsesquioxane resin. Typically the reaction is carried out at a temperature in the range of 5° C. to 150° C., with 15° C. to 40° C. suggested.

The time to form the silsesquioxane resin is dependent upon a number of factors such as the temperature, the type and amount of silane reactants, and the amount of catalyst, if present. Typically the reaction time is from several minutes to several hours. One skilled in the art will be able to readily determine the time necessary to complete the reaction. Catalysts that may be used to facilitate the reaction include, but are not limited to, nitric acid, sulfuric acid, sulfonic acid, hydrochloric acid, and others.

Following completion of the reaction the catalyst may be optionally removed. Methods for removing the catalyst are well know in the art and would include neutralization, stripping or water washing or combinations thereof. The catalyst may negatively impact the shelf life of the silicone resin especially when in solution thus its removal is suggested.

In the process for making the silsesquioxane resin, after the reaction is complete, volatiles may be removed from the silsesquioxane resin solution under reduced pressure. Such volatiles include alcohol by-products, excess water, catalyst, hydrochloric acid (chlorosilane routes) and solvents. Methods for removing volatiles are known in the art and include, for example, distillation.

Following the reaction to produce the silsesquioxane resin a number of optional steps may be carried out to obtain the silsesquioxane resin in the desired form or desired concentration. For example, the silsesquioxane resin may be concentrated by removing the solvent. The method of solvent removal is not critical and numerous methods are well known in the art (e.g. distillation under heat and/or vacuum). Once the concentration of the silsesquioxane resin reaches to a certain concentration, the resin can be diluted with the same or another solvent for a particular use. Alternatively, if a different solvent, other than the solvent used in the reaction, is desired for the final product, a solvent exchange may be done by adding a secondary solvent and removing the first solvent through distillation, for example. Additionally, the resin concentration in solvent can be adjusted by removing some of the solvent or adding additional amounts of solvent.

This invention also pertains to an antireflective coating (ARC) composition comprising
(i) silsesquioxane resin comprised of the units $$(Ph(CH_2)_rSiO_{(3-x)/2}(OR')_x)_m$$

$$(HSiO_{(3-x)/2}(OR')_x)_n$$

$$(MeSiO_{(3-x)/2}(OR')_x)_o$$

$$(RSiO_{(3-x)/2}(OR')_x)_p$$

$$(R^1SiO_{(3-x)/2}(OR')_x)_q$$

where Ph is a phenyl group, Me is a methyl group; R' is hydrogen atom or a hydrocarbon group having from 1 to 4 carbon atoms; R selected from an aryl sulfonate ester group or mixtures of an aryl sulfonate ester group and the equivalent aryl sulfonic acid group with the proviso that in the mixture the majority of R are aryl sulfonate ester groups; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.05 to 0.5; q has a value of 0 to 0.5; and m+n+o+p+q≈1; and
(ii) a solvent.

Useful solvents (ii) include, but are not limited to, 1-methoxy-2-propanol, propylene glycol monomethyl ethyl acetate gamma-butyrolactone, and cyclohexanone, among others. The ARC composition typically comprises from 10% to 99.9 wt % solvent based on the total weight of the ARC composition, alternatively 80 to 95 wt %.

The ARC composition may comprise a free radical initiator or other additives. Suitable free radical initiators include peroxides and photoinitiators such as benzoyl peroxide, dicumyl peroxide, azobisisobutyronitrile (AIBN) and others. Typically the free radical initiator is present in an amount of up to 1000 ppm, alternatively 10 to 500 ppm, based on the total weight of the ARC composition. The other additives may include, but not limited to, photo-acid and thermal-acid generators, photo-base and thermal-base generators.

The antireflective coating compositions are formed by mixing together the silsesquioxane resin, solvent, and optionally the free radical initiator or other additive. Typically the free radical initiator or other additive is added to the coating composition just prior to its use to prevent premature curing.

This invention also pertains to a method of forming an antireflective coating on an electronic device comprising
(A) applying to an electronic device an ARC composition comprising
(i) silsesquioxane resin comprised of the units $$(Ph(CH_2)_rSiO_{(3-x)/2}(OR')_x)_m$$

$$(HSiO_{(3-x)/2}(OR')_x)_n$$

$$MeSiO_{(3-x)/2}(OR')_x)_o$$

$$(RSiO_{(3-x)/2}(OR')_x)_p$$

$$(R^1SiO_{(3-x)/2}(OR')_x)_q$$

where Ph is a phenyl group, Me is a methyl group; R' is hydrogen atom or a hydrocarbon group having from 1 to 4 carbon atoms; R is selected from an aryl sulfonate ester group and a mixture of an aryl sulfonate ester group and the equivalent aryl sulfonic acid group with the proviso that in the mixture the majority of R are aryl sulfonate ester groups; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.05 to 0.5; q has a value of 0 to 0.5; and m+n+o+p+q≈1; and
(ii) a solvent, and
(B) removing the solvent and curing the silsesquioxane resin to form an antireflective coating on the electronic device.

The antireflective coating composition is applied to an electronic device to produce a coated substrate. The solvent is removed and the silsesquioxane resin is cured to produce the antireflective coating on the electronic device.

Typically the electronic device is a semiconductor device, such as silicon-based devices and gallium arsenide-based devices intended for use in the manufacture of a semiconductor component. Typically, the device comprises at least one semiconductive layer and a plurality of other layers comprising various conductive, semiconductive, or insulating materials.

Specific methods for application of the ARC composition to the electronic device include, but are not limited to, spin-coating, dip-coating, spray-coating, flow-coating, screen-printing and others. The preferred method for application is spin coating. Typically, coating involves spinning the electronic device, at about 2000 RPM, and adding the ARC composition to the surface of the spinning electronic device.

The solvent is removed and the silsesquioxane resin is cured to form the anti-reflective coating on the electronic device. Curing generally comprises heating the coating to a sufficient temperature for a sufficient duration to lead to curing. Curing occurs when sufficient crosslinking has taken place such that the silsesquioxane resin is essentially insoluble in the solvent from which it was applied. Curing may take place for example by heating the coated electronic device at 80° C. to 450° C. for 0.1 to 60 minutes, alternatively 150° C. to 275° C. for of 0.5 to 5 minutes, alternatively 200° C. to 250° C. for 0.5 to 2 minutes. Any method of heating may be used during the curing step. For example, the coated electronic device may be placed in a quartz tube furnace, convection oven or allowed to stand on hot plates. Alternatively, the anti-reflective coating can be cured under ultraviolet irradiation in the presence of photoactive additives, such as photoacid generator (PAG) or photobase generators.

To protect the silsesquioxane resin of the coated composition from reactions with oxygen or carbon during curing, the curing step can be performed under an inert atmosphere. Inert atmospheres useful herein include, but are not limited to nitrogen and argon. By "inert" it is meant that the environment contain less than 50 ppm and preferably less than 10 ppm of oxygen. The pressure at which the curing and removal steps are carried out is not critical. The curing step is typically carried out at atmospheric pressure although sub or super atmospheric pressures may work also.

Once cured, the electronic device comprising the anti-reflective coating can be used in further substrate processing steps, such as photolithography. When used in photolithography, a resist image is formed over the anti-reflective coating. The process for forming the resist image comprises (a) forming a film of a resist composition on top of the anti-reflective coating; (b) imagewise exposing the resist film to radiation to produce an exposed film; and (c) developing the exposed film to produce an image. The anti-reflective coatings on the electronic device are particularly useful with resist compositions that are imagewise exposed to ultraviolet radiation having a wavelength of 157 nm to 365 nm, alternatively ultraviolet radiation having a wavelength of 157 nm or 193 nm. Once an image has been produced in the resist film, then a pattern is etched in the anti-reflective coating. Known etching materials may be used to remove the anti-reflective coating. Additional steps or removing the resist film and remaining anti-reflective coating may be employed to produce a device having the desired architecture.

The ARC coating compositions can be cured at lower temperatures and they produce coatings that can be removed by stripping solutions. It has been found that the antireflective coatings produced herein have better solvent (e.g. PGMEA) and TMAH resistance. Additionally, these resins when used in ARC coatings provide outstanding optical, mechanical and etch selectivity properties while being applicable using spin-on application techniques.

EXAMPLES

The following examples are included to demonstrate embodiments of the invention. It should be appreciated by those of skill in the art that the techniques disclosed in the examples which follow represent techniques discovered by the inventor to function well in the practice of the invention, and thus can be considered to constitute preferred modes for its practice. However, those of skill in the art should, in light of the present disclosure, appreciate that many changes can be made in the specific embodiments which are disclosed and still obtain a like or similar result without departing from the spirit and scope of the invention. All percentages are in wt. %. In the following examples

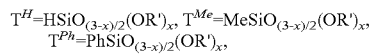

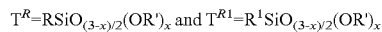

Example 1

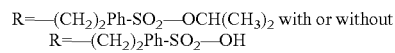

A mixture of 486.9 g of propylene glycol methyl ether acetate (PGMEA), 50.72 g of 2-(4-chlorosulfonylphenyl)ethyltrichlorosilane toluene solution (50%) (0.075 mol), 31.73 g of phenyltrichlorosilane (0.150 mol), 145.74 g of methyltrichlorosilane (0.975 mol), and 40.64 g of trichlorosilane (0.300 mol) was transferred to a reactor under nitrogen. A solution of 1123.29 g of PGMEA, 59.4 g of isopropanol (1.0 mol), and 59.4 g of deionized water (3.30 mol) was added to the solution of the trichlorosilanes over a one-hour period at 20° C. while the mixture was being stirred. The reaction was allowed to body at 30° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 100 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1450 g) was then concentrated to approximately 20 wt. % by rotary evaporator at 40° C. after 145 g of ethanol was added to the cloudy solution. The above solution was transferred to a 5 L round-bottomed flask. While being stirred, about 2200 g of hexanes was added to the solution. The mixture was let standing for 5 min. The bottom viscous liquid was drain to a 1 L pear-shaped flask was diluted to 600 g by adding PGMEA. The solution was concentrated to 11 wt. %. The solution was diluted to 10 wt. % by adding PGMEA.

Example 2

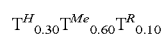

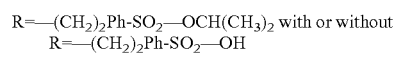

A mixture of 738.6 g of propylene glycol methyl ether acetate (PGMEA), 101.4 g of 2-(4-chlorosulfonylphenyl)ethyltrichlorosilane toluene solution (50%) (0.150 mol), 134.5 g of methyltrichlorosilane (0.900 mol), 60.95 g of trichlorosilane (0.450 mol) was transferred to a reactor under nitrogen. A solution of 891.4 g of PGMEA, 59.4 g of isopropanol (1.0 mol), and 59.4 g of deionized water (3.30 mol) was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 200 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1623 g) was then concentrated to 479 g of solution (about 20 wt. %) by rotary evaporator at 40° C. after 164 g of ethanol was added to the cloudy solution. The above solution was transferred to a 5

L round-bottomed flask. While being stirred, 2051 g of hexanes was added to the solution. The mixture was let standing for 5 min. The bottom viscous liquid was drain to a 1 L pear-shaped flask was diluted to 702 g by adding PGMEA. The solid resin weight based on the nonvolatile content was 51.7%. The solution was concentrated to 12 wt. %. The solution was diluted to 517 g (10 wt %) by adding PGMEA. The yield was 46%.

Example 3

$T^H{}_{0.20}T^{Me}{}_{0.73}T^R{}_{0.070}$

R=—(CH$_2$)$_2$Ph-SO$_2$—OCH(CH$_3$)$_2$ with or without R=—(CH$_2$)$_2$Ph-SO$_2$—OH A mixture of 719.6 g of propylene glycol methyl ether acetate (PGMEA), 71.0 g of 2-(4-chlorosulfonylphenyl) ethyltrichlorosilane toluene solution (50%) (0.105 mol), 163.7 g of methyltrichlorosilane (1.095 mol), 40.64 g of trichlorosilane (0.300 mol) was transferred to a reactor under nitrogen. A solution of 824.3 g of PGMEA, 59.3 g (1.0 mol) of isopropanol, and 59.6 g (3.3 mol) of deionized water was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was allowed to stand for about 15 min to phase separate. The bottom aqueous phase was removed. To the remaining upper phase was added 100 g of PGMEA and 500 g of deionized water was added and the mixture was stirred for 10 s. The mixture was let standing for about 15 min to phase separate. The bottom aqueous phase was removed. This wash process was repeated two more times until the pH value of the aqueous phase is above 3. The cloudy resin solution (1683 g) was then concentrated to approximately 20 wt % (473 g) by rotary evaporator at 40° C. after 169 g of ethanol was added to the cloudy solution. The above solution was transferred to a 5 L round-bottomed flask. While being stirred, about 2200 g of hexanes was added to the solution. The mixture was let standing for 5 min. The bottom viscous liquid was drain to a 1 L pear-shaped flask was diluted to 600 g. The solution was concentrated to 12 wt. %. The solution was diluted to 472 g (10%) by adding PGMEA. The yield was 41.4%.

Example 4

$T^H{}_{0.30}T^{Me}{}_{0.625}T^R{}_{0.075}$

R=—(CH$_2$)$_2$Ph-SO$_2$—OCH$_2$CH$_3$ with or without R=—(CH$_2$)$_2$Ph-SO$_2$—OH A mixture of 717.4 g of propylene glycol methyl ether acetate (PGMEA), 76.2 g of 2-(4-chlorosulfonylphenyl) ethyltrichlorosilane toluene solution (50%) (0.113 mol), 140.3 g of methyltrichlorosilane (0.938 mol), 61.0 g of trichlorosilane (0.450 mol) was transferred to a reactor under nitrogen. A solution of 826.7 g of PGMEA, 46.3 g (1.0 mol) of ethanol, and 59.4 g (3.30 mol) of deionized water was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 100 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1623 g) was then concentrated to approximately 20 wt % by rotary evaporator at 40° C. after 164 g of ethanol was added to the cloudy solution. The above solution (479 g) was transferred to a 5 L round-bottomed flask. While being stirred, 2051 g of hexanes was added to the solution. The mixture was let standing for 5 min. The bottom viscous liquid was drain to a 1 L pear-shaped flask was diluted to 600 g. The solution was concentrated to 12 wt. %. The solution was diluted to 517 g (10%) by adding PGMEA. The yield was 46%.

Example 5

$T^H{}_{0.20}T^{Me}{}_{0.73}T^R{}_{0.070}$

R=—(CH$_2$)$_2$Ph-SO$_2$—OCH$_3$ with or without R=—(CH$_2$)$_2$Ph-SO$_2$—OH

A mixture of 851.8 g of propylene glycol methyl ether acetate (PGMEA), 71.0 g of 2-(4-chlorosulfonylphenyl) ethyltrichlorosilane toluene solution (50%) (0.105 mol), 163.8 g of methyltrichlorosilane (1.095 mol), 40.7 g of trichlorosilane (0.300 mol) was transferred to a reactor under nitrogen. A solution of 851.8 g of PGMEA, 32.0 g (1.0 mol) of methanol, and 59.5 g (3.3 mol) of deionized water was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was allowed to stand for about 15 min to phase separate. The bottom aqueous phase was removed. To the remaining upper phase was added 100 g of PGMEA and 500 g of deionized water was added and the mixture was stirred for 10 s. The mixture was let standing for about 15 min to phase separate. The bottom aqueous phase was removed. This wash process was repeated two more times until the pH value of the aqueous phase is above 3. The cloudy resin solution (1822 g) was then concentrated to approximately 20 wt % (492 g) by rotary evaporator at 40° C. after 183 g of ethanol was added to the cloudy solution. The above solution was transferred to a 5 L round-bottomed flask. While being stirred, about 1920 g of hexanes was added to the solution. The mixture was let standing for 5 min. The bottom viscous liquid was drain to a 1 L pear-shaped flask was diluted to 600 g. The solution was concentrated to 12 wt. %. The solution was diluted to 375 g (10%) by adding PGMEA. The yield was 32.8%.

Example 6

$T^H{}_{0.20}T^{Me}{}_{0.73}T^R{}_{0.070}$

R=—(CH$_2$)$_2$Ph-SO$_2$—OC(CH$_3$)$_3$ with or without R=—(CH$_2$)$_2$Ph-SO$_2$—OH A mixture of 719.5 g of propylene glycol methyl ether acetate (PGMEA), 71.0 g of 2-(4-chlorosulfonylphenyl) ethyltrichlorosilane toluene solution (50%) (0.105 mol), 163.7 g of methyltrichlorosilane (1.095 mol), 40.6 g of trichlorosilane (0.300 mol) was transferred to a reactor under nitrogen. A solution of 809.8 g of PGMEA, 74.1 g (1.0 mol) of tert-butyl alcohol, and 59.5 g (3.3 mol) of deionized water was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was allowed to stand for about 15 min to phase separate. The bottom aqueous phase was removed. To the remaining upper phase was added 100 g of PGMEA and 500 g of deionized water was added and the mixture was stirred for 10 s. The mixture was let standing for about 15 min to phase separate. The bottom aqueous phase was removed. This wash process was repeated two more times until the pH value of the aqueous phase is above 3. The cloudy resin solution (1961 g) was then concentrated to approximately 20 wt % (535 g) by rotary evaporator at 40° C. after 196 g of ethanol was added to the cloudy solution. The above solution was transferred to a 5 L round-bottomed flask. While being stirred, about 2200 g of hexanes was added to the solution. The mixture was let standing for 5 min. The bottom viscous liquid was drain to a 1 L pear-shaped flask was diluted to 600 g. The solution was concentrated to 12 wt. %. The solution was diluted to 550 g (10%) by adding PGMEA. The yield was 48.2%.

Example 7

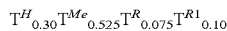

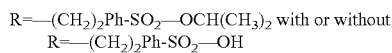

A mixture of 795.7 g of propylene glycol methyl ether acetate (PGMEA), 76.1 g of 2-(4-chlorosulfonylphenyl) ethyltrichlorosilane toluene solution (50%) (0.113 mol), 48.6 g of polypropyleneoxidetrichlorosilane ($Cl_3Si$—$(CH_2)_3$[O($CH_2CH(CH_3)$)]$_2OCH_3$), 117.7 g of methyltrichlorosilane (0.788 mol), 60.95 g of trichlorosilane (0.450 mol) was transferred to a reactor under nitrogen. A solution of 1144.1 g of PGMEA, 59.4 g (1.0 mol) of isopropanol, and 59.5 g (3.30 mol) of deionized water was added to the solution of the trichlorosilanes over a one-hour period at 15° C. while the mixture was being stirred. The reaction was allowed to body at 30° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 100 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1690 g) was then concentrated to 450 g by rotary evaporator at 40° C. after 169 g of ethanol was added to the cloudy solution. The above solution was transferred to a 5 L round-bottomed flask. While being stirred, about 2000 g of hexanes was added to the solution. The mixture was let standing for 5 min. The bottom viscous liquid was drain to a 1 L pear-shaped flask was diluted to 600 g. The solution was concentrated to 410 g (17.5 wt %) and then diluted to 467 g (15%) by adding PGMEA. The yield was 50%.

Example 8

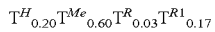

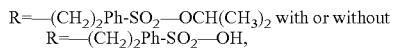

$R^1$ is —$CH_2CH_2CH_2CH_2SH$

A mixture of 721.4 g of propylene glycol methyl ether acetate (PGMEA), 30.4 g of 2-(4-chlorosulfonylphenyl) ethyltrichlorosilane toluene solution (50%) (0.045 mol), 50.1 g of 3-mercaptopropyltrimethoxysilane (($CH_3O)_3Si$—$CH_2CH_2CH_2SH$ (0.255 mol), 134.5 g of methyltrichlorosilane (0.900 mol), 40.7 g of trichlorosilane (0.300 mol) was transferred to a reactor under nitrogen. A solution of 907.1 g of PGMEA, 59.5 g (1.0 mol) of isopropanol, and 59.1 g (3.30 mol) of deionized water was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 100 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1500 g) was then concentrated to 436 g by rotary evaporator at 40° C. after 150 g of ethanol was added to the cloudy solution. The above solution was transferred to a 5 L round-bottomed flask. While being stirred, 2300 g of hexanes was added to the solution. The mixture was let standing for 5 min. The bottom viscous liquid was drain to a 1 L pear-shaped flask was diluted to 600 g. The solution was concentrated to 407 g (10 wt %). The yield was 34%.

Example 9

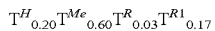

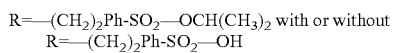

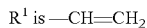 is —$CH$=$CH_2$

A mixture of 694.7 g of propylene glycol methyl ether acetate (PGMEA), 30.4 g of 2-(4-chlorosulfonylphenyl) ethyltrichlorosilane toluene solution (50%) (0.045 mol), 41.3 g of vinyltrichlorosilane ($Cl_3Si$—$CH$=$CH_2$) (0.255 mol), 134.5 g of methyltrichlorosilane (0.900 mol), 40.7 g of trichlorosilane (0.300 mol) was transferred to a reactor under nitrogen. A solution of 738.6 g of PGMEA, 59.3 g (1.0 mol) of isopropanol, and 60.0 g (3.30 mol) of deionized water was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 100 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1551 g) was then concentrated to 460 g by rotary evaporator at 40° C. after 156 g of ethanol was added to the cloudy solution. The above solution was transferred to a 5 L round-bottomed flask. While being stirred, 2300 g of hexanes was added to the solution. The mixture was let standing for 5 min. The bottom viscous liquid was drain to a 1 L pear-shaped flask was diluted to 600 g. The solution was concentrated to 278 g (10 wt %). The yield was 26%.

Example 10

R=—(CH$_2$)$_2$Ph-SO$_2$—OCH(CH$_3$)$_2$ with or without
R=—(CH$_2$)$_2$Ph-SO$_2$—OH R$^1$ is —(CH$_2$)$_3$[O(CH$_2$CH(CH$_3$))]$_2$OCH$_3$ A mixture of 756 g of propylene glycol methyl ether acetate (PGMEA), 50.8 g of 2-(4-chlorosulfonylphenyl) ethyltrichlorosilane toluene solution (50%) (0.075 mol), 24.3 g of polypropyleneoxidetrichlorosilane (Cl$_3$Si—(CH$_2$)$_3$[O(CH$_2$CH(CH$_3$))]$_2$OCH$_3$) (0.075 mol), 145.7 g of methyltrichlorosilane (0.975 mol), 40.6 g of trichlorosilane (0.300 mol) was transferred to a reactor under nitrogen. A solution of 986 g of PGMEA, 59.4 g (1.0 mol) of isopropanol, and 59.4 g (3.30 mol) of deionized water was added to the solution of the trichlorosilanes over a one-hour period at 15° C. while the mixture was being stirred. The reaction was allowed to body at 15° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 100 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1705 g) was then concentrated to 460 g by rotary evaporator at 40° C. after 170 g of ethanol was added to the cloudy solution. The above solution was transferred to a 5 L round-bottomed flask. While being stirred, 2300 g of hexanes was added to the solution. The mixture was let standing for 5 min. The bottom viscous liquid was drain to a 1 L pear-shaped flask was diluted to 600 g. The solution was concentrated to 502 g (10 wt %). The yield was 40%.

Example 11

$T^H{}_{0.20}T^{Me}{}_{0.59}T^R{}_{0.06}T^{R1}{}_{0.10}Q_{0.05}$

R=—(CH$_2$)$_2$Ph-SO$_2$—OCH(CH$_3$)$_2$ with or without
R=—(CH$_2$)$_2$Ph-SO$_2$—OH R$^1$ is —(CH$_2$)$_3$[O(CH$_2$CH(CH$_3$))]$_2$OCH$_3$ A mixture of 802.5 g of propylene glycol methyl ether acetate (PGMEA), 60.8 g of 2-(4-chlorosulfonylphenyl) ethyltrichlorosilane toluene solution (50%) (0.090 mol), 48.5 g of polypropyleneoxidetrichlorosilane (Cl$_3$Si—(CH$_2$)$_3$[O(CH$_2$CH(CH$_3$))]$_2$OCH$_3$) (0.150 mol), 15.6 g of tetraethyl orthosilicate (0.075 mol), 132.3 g of methyltrichlorosilane (0.885 mol), 40.6 g of trichlorosilane (0.300 mol) was transferred to a reactor under nitrogen. A solution of 1097.4 g of PGMEA, 59.4 g (1.0 mol) of isopropanol, and 59.4 g (3.30 mol) of deionized water was added to the solution of the trichlorosilanes over a one-hour period at 15° C. while the mixture was being stirred. The reaction was allowed to body at 30° C. for another hour while stirred. The solution was diluted by adding 400 g of PGMEA. Then 500 g of deionized water was added and the mixture was stirred for 10 s. The mixture was let standing for about 5 min to phase separate. The bottom aqueous phase was removed. To the remaining upper phase was added 100 g of PGMEA and 500 g of deionized water and the mixture was stirred for 10 s. The mixture was let standing for about 15 min to phase separate. The bottom aqueous phase was removed. This wash process was repeated two more times until the pH value of the aqueous phase is above 3. The cloudy resin solution (1798 g) was then concentrated to 460 g by rotary evaporator at 40° C. after 181 g of ethanol was added to the cloudy solution. The above solution was transferred to a 5 L round-bottomed flask. While being stirred, 2300 g of hexanes was added to the solution. The mixture was let standing for 5 min. The bottom viscous liquid was drain to a 1 L pear-shaped flask was diluted to 600 g. The solution was concentrated to 572 g (10 wt %). The yield was 42%.

Example 12

Film Coating and Characterization

Film coating on wafers was processed on a Karl Suss CT62 spin coater. The resin PGMEA solution was first filtered through a 0.2 micron Telfon filter and then spin coated onto standard single side four inch polished low resistively wafers or double sided polished FTIR wafers (spin speed 2000-4000 rpm). Films were cured at a temperature of 200 to 250° C. for 60 sec. on a hotplate. The film thickness, refractive index, and k value were measured using a J. A. Woollam ellipsometer. The thickness values recorded were the average of nine measurements. PGMEA resistance after cure was determined by measuring the film thickness change before and after PGMEA rinse. The wet removal rate was assessed with two commercial wet stripping solutions NE89 and CC1. Contact angle measurements were conducted using water and methylene iodide as liquid and the critical surface tension of wetting was calculated based on the Zisman approach. Results are summarized in Table 1.

TABLE 1

| | | | | | | | | | |
|---|---|---|---|---|---|---|---|---|---|
| | | | | Film Coating and Characterization Results | | | | | |
| | | | | Thin | Thickness | Thickness | | | Water | |
| | | | | Film Cure | Change in | Change in | | | Contact | Surface |
| | | $M_w$ | $M_w/M_n$ | Temp. | PGMEA | TMAH | | | Angle | Tension |
| Resin Nominal Composition | | vs. PS | vs. PS | (° C.) | (Å) | (Å) | n | k | (°) | (N/m) |
| $T^H{}_{0.20}T^{Me}{}_{0.63}T^{Sul}{}_{0.07}$ | | 14500 | 4.23 | 250 | 76 | 7 | 1.585 | 0.139 | 91.8 | 25.4 |
| $T^H{}_{0.30}T^{Me}{}_{0.53}T^{Sul}{}_{0.07}$ | | 16000 | 4.39 | 250 | 96 | 8 | 1.586 | 0.139 | 91.7 | 25.7 |

TABLE 1-continued

Film Coating and Characterization Results

| Resin Nominal Composition | $M_w$ vs. PS | $M_w/M_n$ vs. PS | Thin Film Cure Temp. (°C.) | Thickness Change in PGMEA (Å) | Thickness Change in TMAH (Å) | n | k | Water Contact Angle (°) | Surface Tension (N/m) |
|---|---|---|---|---|---|---|---|---|---|
| $T^H_{0.30} T^{Me}_{0.60} T^{Sul}_{0.10}$ | 10000 | 3.26 | 240 | 146 | 42 | 1.601 | 0.202 | 89.7 | 27.2 |
| $T^H_{0.30} T^{Me}_{0.625} T^{Sul}_{0.075}$ | 15800 | 3.56 | 240 | 233 | 39 | 1.590 | 0.159 | 91.7 | 26.9 |
| $T^H_{0.20} T^{Me}_{0.65} T^{Sul}_{0.05}$ | 27900 | 4.97 | 240 | 186 | 27 | 1.570 | 0.108 | 90.8 | 26.2 |
| $T^H_{0.30} T^{Me}_{0.625} T^{Sul}_{0.075}$*a | 14200 | 4.18 | 240 | 110 | 27 | 1.589 | 0.150 | 91.5 | 27.1 |
| $T^H_{0.20} T^{Me}_{0.73} T^{Sul}_{0.07}$*b | 11900 | 4.23 | 250 | 12 | 7 | 1.578 | 0.139 | 92.0 | 25.7 |
| $T^H_{0.20} T^{Me}_{0.73} T^{Sul}_{0.07}$*c | 15900 | 4.71 | 250 | 9 | 8 | 1.578 | 0.136 | 92.0 | 25.6 |
| $T^H_{0.20} T^{Me}_{0.70} T^{Sul}_{0.05} T^{Ph}_{0.05}$ | 16400 | 3.75 | 240 | 165 | 18 | 1.656 | 0.190 | 89.2 | 26.2 |
| $T^H_{0.30} T^{Me}_{0.61} T^{Sul}_{0.05} T^{Ph}_{0.04}$ | 24200 | 3.63 | 240 | 238 | 41 | 1.638 | 0.177 | 89.3 | 27.5 |
| $T^H_{0.20} T^{Me}_{0.70} T^{Sul}_{0.05} T^{PPO}_{0.05}$ | 15800 | 3.54 | 240 | 105 | 14 | 1.583 | 0.105 | 85.0 | 27.7 |
| $T^H_{0.20} T^{Me}_{0.60} T^{Sul}_{0.025} T^{PPO}_{0.175}$ | 15800 | 2.58 | 240 | 8 | 231 | 1.578 | 0.059 | 67.5 | 37.7 |
| $T^H_{0.20} T^{Me}_{0.60} T^{Sul}_{0.05} T^{PPO}_{0.15}$ | 11000 | 2.50 | 240 | 22 | 103 | 1.596 | 0.100 | 86.0 | 29.2 |
| $T^H_{0.20} T^{Me}_{0.60} T^{Sul}_{0.0755} T^{PPO}_{0.125}$ | 10800 | 2.95 | 240 | 59 | 44 | 1.611 | 0.141 | 78.0 | 32.0 |
| $T^H_{0.30} T^{Me}_{0.60} T^{Sul}_{0.10} T^{PPO}_{0.10}$ | 9100 | 3.19 | 240 | 51 | 20 | 1.617 | 0.171 | 81.0 | 31.9 |
| $T^H_{0.20} T^{Me}_{0.50} T^{Sul}_{0.15} T^{PPO}_{0.15}$ | 7010 | 2.25 | 240 | 105 | 59 | 1.640 | 0.232 | 75.8 | 33.7 |
| $T^H_{0.20} T^{Me}_{0.60} T^{Sul}_{0.03} T^{Vinyl}_{0.17}$ | 30700 | 6.90 | 240 | 92 | 11 | 1.604 | 0.086 | 90.0 | 26.6 |
| $T^H_{0.20} T^{Me}_{0.60} T^{Sul}_{0.06} T^{Vinyl}_{0.14}$ | 15700 | 3.91 | 240 | 99 | 10 | 1.619 | 0.139 | 90.0 | 27.0 |
| $T^H_{0.20} T^{Me}_{0.60} T^{Sul}_{0.03} T^{SH}_{0.17}$ | 9840 | 2.91 | 240 | 133 | 18 | 1.619 | 0.089 | 133 | 18 |
| $T^H_{0.20} T^{Me}_{0.60} T^{Sul}_{0.06} T^{SH}_{0.14}$ | 9580 | 3.02 | 240 | 49 | 11 | 1.624 | 0.138 | 49 | 11 |
| $T^H_{0.20} T^{Me}_{0.65} T^{Sul}_{0.05} T^{Ph}_{0.05} T^{PPO}_{0.05}$ | 10600 | 2.50 | 240 | 321 | 21 | 1.656 | 0.182 | 86.0 | 27.9 |
| $T^H_{0.20} T^{Me}_{0.59} T^{Sul}_{0.06} T^{PP}_{0.10} Q_{0.05}$ | 11700 | 2.62 | 240 | 55 | 30 | 1.595 | 0.110 | 79.0 | 31.8 |

(All the Sulfs represent —(CH$_2$)$_2$Ph—SO$_2$—OCH(CH$_3$)$_2$ and R = —(CH$_2$)$_2$Ph—SO$_2$—OH, except that $T^H_{0.30} T^{Me}_{0.625} T^{Sul}_{0.075}$*a, $T^H_{0.20} T^{Me}_{0.73} T^{Sul}_{0.07}$*b, and $T^H_{0.20} T^{Me}_{0.73} T^{Sul}_{0.07}$*c, in which Sulfs represent R = —(CH$_2$)$_2$Ph—SO$_2$—OCH$_2$CH$_3$ and R = —(CH$_2$)$_2$Ph—SO$_2$—OH, —(CH$_2$)$_2$Ph—SO$_2$—OCH$_3$ and R = —(CH$_2$)$_2$Ph—SO$_2$—OH, and —(CH$_2$)$_2$Ph—SO$_2$—OC(CH$_3$)$_3$ and R = —(CH$_2$)$_2$Ph—SO$_2$—OH, respectively)

We claim:

1. A silsesquioxane resin comprised of the units $$(Ph(CH_2)_rSiO_{(3-x)/2}(OR')_x)_m$$

$$(HSiO_{(3-x)/2}(OR')_x)_n$$

$$MeSiO_{(3-x)/2}(OR')_x)_o$$

$$(RSiO_{(3-x)/2}(OR')_x)_p$$

$$(R^1SiO_{(3-x)/2}(OR')_x)_q$$

where Ph is a phenyl group, Me is a methyl group; R' is hydrogen atom or a hydrocarbon group having from 1 to 4 carbon atoms; R is an aryl sulfonate ester group or a mixture of an aryl sulfonate ester group and an equivalent aryl sulfonic acid group with the proviso that in the mixture the majority of R are aryl sulfonate ester groups; and R$^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.025 to 0.5; q has a value of 0 to 0.5; and m+n+o+p+q≈1.

2. The resin as claimed in claim 1 wherein m has a value of 0 to 0.25, n has a value of 0.15 to 0.40, o has a value of 0.25 to 0.80, p has a value of 0.025 to 0.2 and q has a value of 0 to 0.2.

3. The resin as claimed in claim 1 wherein m has a value of >0 to 0.10, n has a value of 0.15 to 0.3, o has a value of 0.40 to 0.75, p has a value of 0.03 to 0.15 and q has a value of >0 to 0.15.

4. The resin as claimed in claim 1 wherein the sulfonate ester group has the formula R$^2$O—SO$_2$-Ph-(CH$_2$)$_r$— where R$^2$ is an aliphatic group or an aromatic group and r has a value of 0, 1, 2, 3, or 4.

5. The resin as claimed in claim 4 wherein the sulfonate ester group has the formula —(CH$_2$)$_2$Ph-SO$_2$—OCH(CH$_3$)$_2$.

6. The resin as claimed in claim 4 wherein the sulfonate ester group has the formula —(CH$_2$)$_2$Ph-SO$_2$—OCH$_2$CH$_3$.

7. The resin as claimed in claim 1 wherein R$^1$ is a polyether group.

8. The resin as claimed in claim 1 wherein R$^1$ is a mercapto group.

9. The resin as claimed in claim 1 wherein R$^1$ is an alkenyl group.

10. The resin as claimed in claim 1 wherein the resin contains 6 to 38 mole % of units having —OR' groups.

11. The resin as claimed in claim 1 wherein the resin has an average molecular weight (Mw) of 700 to 30,000.

12. An antireflective coating composition comprising
(i) silsesquioxane resin comprised of the units $$(Ph(CH_2)_rSiO_{(3-x)/2}(OR')_x)_m$$

$$(HSiO_{(3-x)/2}(OR')_x)_n$$

$(\text{MeSiO}_{(3-x)/2}(\text{OR}')_x)_o$ $(\text{RSiO}_{(3-x)/2}(\text{OR}')_x)_p$ $(\text{R}^1\text{SiO}_{(3-x)/2}(\text{OR}')_x)_q$ where Ph is a phenyl group, Me is a methyl group; R' is hydrogen atom or a hydrocarbon group having from 1 to 4 carbon atoms; R is selected from an aryl sulfonate ester group and a mixture of an aryl sulfonate ester group and the equivalent aryl sulfonic acid group with the proviso that in the mixture the majority of R are aryl sulfonate ester groups; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.025 to 0.5; q has a value of 0 to 0.5; and $m+n+o+p+q\approx1$; and (ii) a solvent.

13. The antireflective coating composition as claimed in claim 12 wherein m has a value of 0 to 0.25, n has a value of 0.15 to 0.40, o has a value of 0.25 to 0.80, p has a value of 0.025 to 0.2 and q has a value of 0 to 0.2.

14. The antireflective coating composition as claimed in claim 12 wherein m has a value of >0 to 0.10, n has a value of 0.15 to 0.3, o has a value of 0.40 to 0.75, p has a value of 0.03 to 0.15 and q has a value of >0 to 0.15.

15. The antireflective coating composition as claimed in claim 12 wherein the sulfonate ester group has the formula $R^2O\text{—SO}_2\text{-Ph-}(CH_2)_r\text{—}$ where $R^2$ is an aliphatic group or an aromatic group and r has a value of 0, 1, 2, 3, or 4.

16. The antireflective coating composition as claimed in claim 15 wherein the sulfonate ester group has the formula $\text{—}(CH_2)_2\text{Ph-SO}_2\text{—OCH}_2\text{CH}_3$.

17. The antireflective coating composition as claimed in claim 15 wherein the sulfonate ester group has the formula $\text{—}(CH_2)_2\text{Ph-SO}_2\text{—OCH}_2\text{CH}_3$.

18. The antireflective coating composition as claimed in claim 12 wherein $R^1$ is a polyether group.

19. The antireflective coating composition as claimed in claim 12 wherein $R^1$ is a mercapto group.

20. The antireflective coating composition as claimed in claim 12 wherein $R^1$ is an alkenyl group.

21. The antireflective coating composition as claimed in claim 12 wherein the resin contains 6 to 38 mole % of units having —OR' groups.

22. The antireflective coating composition as claimed in claim 12 wherein the resin has an average molecular weight (Mw) of 700 to 30,000.

23. The antireflective coating composition as claimed in claim 12 wherein the solvent is selected from 1-methoxy-2-propanol, propylene glycol monomethyl ethyl acetate gamma-butyrolactone, and cyclohexanone and mixtures thereof.

24. The antireflective coating composition as claimed in claim 12 wherein there is 10% to 99.9 wt % solvent based on the total weight of the antireflective coating composition.

25. The antireflective coating composition as claimed in claim 12 wherein there is 80 to 95 wt % solvent based on the total weight of the antireflective coating composition.

26. The antireflective coating composition as claimed in claim 12 wherein the composition additionally contains a free radical initiator, photo-acid generator, thermal-acid generator, photo-base generator, thermal-base generator and mixtures thereof.

27. A method for forming an antireflective coating on an electronic device comprising
(A) applying to an electronic device an antireflective coating composition comprising
(i) silsesquioxane resin comprised of the units $(\text{Ph}(CH_2)_r\text{SiO}_{(3-x)/2}(\text{OR}')_x)_m$ $(\text{HSiO}_{(3-x)/2}(\text{OR}')_x)_n$ $\text{MeSiO}_{(3-x)/2}(\text{OR}')_x)_o$ $(\text{RSiO}_{(3-x)/2}(\text{OR}')_x)_p$ $(\text{R}^1\text{SiO}_{(3-x)/2}(\text{OR}')_x)_q$ where Ph is a phenyl group, Me is a methyl group; R' is hydrogen atom or a hydrocarbon group having from 1 to 4 carbon atoms; R is selected from an aryl sulfonate ester group and a mixture of an aryl sulfonate ester group and the equivalent aryl sulfonic acid group with the proviso that in the mixture that the majority of R are aryl sulfonate ester groups; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.025 to 0.5; q has a value of 0 to 0.5; and $m+n+o+p+q\approx1$; and
(ii) a solvent, and
(B) removing the solvent and curing the silsesquioxane resin to form an antireflective coating on the electronic device.

28. The method as claimed in claim 27 wherein m has a value of 0 to 0.25, n has a value of 0.15 to 0.40, o has a value of 0.25 to 0.80, p has a value of 0.025 to 0.2 and q has a value of 0 to 0.2.

29. The method as claimed in claim 27 wherein m has a value of >0 to 0.10, n has a value of 0.15 to 0.3, o has a value of 0.40 to 0.75, p has a value of 0.03 to 0.15 and q has a value of >0 to 0.15.

30. The method as claimed in claim 27 wherein the sulfonate ester group has the formula $R^2O\text{—SO}_2\text{-Ph-}(CH_2)_r\text{—}$ where $R^2$ is an aliphatic group or an aromatic group and r has a value of 0, 1, 2, 3, or 4.

31. The method as claimed in claim 30 wherein the sulfonate ester group has the formula $\text{—}(CH_2)_2\text{Ph-SO}_2\text{—OCH}(CH_3)_2$.

32. The method as claimed in claim 30 wherein the sulfonate ester group has the formula $\text{—}(CH_2)_2\text{Ph-SO}_2\text{—OCH}_2\text{CH}_3$.

33. The method as claimed in claim 27 wherein $R^1$ is a polyether group.

34. The method as claimed in claim 27 wherein $R^1$ is a mercapto group.

35. The method as claimed in claim 27 wherein $R^1$ is an alkenyl group.

36. The method as claimed in claim 27 wherein the resin contains 6 to 38 mole % of units having —OR' groups.

37. The method as claimed in claim 27 wherein the resin has an average molecular weight (Mw) of 700 to 30,000.

38. The method as claimed in claim 27 wherein the solvent is selected from 1-methoxy-2-propanol, propylene glycol monomethyl ethyl acetate gamma-butyrolactone, and cyclohexanone and mixtures thereof.

39. The method as claimed in claim 27 wherein there is 10% to 99.9 wt % solvent based on the total weight of the antireflective coating composition.

40. The method as claimed in claim 27 wherein there is 80 to 95 wt % solvent based on the total weight of the antireflective coating composition.

41. The method as claimed in claim 27 wherein the composition additionally contains a free radical initiator, photo-acid generator, thermal-acid generator, photo-base generator, thermal-base generator and mixtures thereof.

42. The method as claimed in claim 27 wherein the antireflective coating composition is applied by spin-coating, dip-coating, spray-coating, flow-coating, or screen printing.

43. The method as claimed in claim 42 wherein the antireflective coating composition is applied by spin-coating.

44. The method as claimed in claim 27 wherein removing the solvent and curing comprises heating the coated substrate to 80° C. to 450° C. for 0.1 to 60 minutes.

45. The method as claimed in claim 27 wherein the curing takes place in an inert atmosphere.

46. A method comprising
(A) applying to an electronic device an antireflective coating composition comprising
  (i) silsesquioxane resin comprised of the units $(Ph(CH_2)_rSiO_{(3-x)/2}(OR')_x)_m$ $(HSiO_{(3-x)/2}(OR')_x)_n$ $MeSiO_{(3-x)/2}(OR')_x)_o$ $(RSiO_{(3-x)/2}(OR')_x)_p$ $(R^2SiO_{(3-x)/2}(OR')_x)_q$ where Ph is a phenyl group, Me is a methyl group; R' is hydrogen atom or a hydrocarbon group having from 1 to 4 carbon atoms; R is selected from an aryl sulfonate ester group and a mixture of an aryl sulfonate ester group and the equivalent aryl sulfonic acid group with the proviso that in the mixture that the majority of R are aryl sulfonate ester groups; and $R^1$ is selected from substituted phenyl groups, ester groups, polyether groups; mercapto groups, and reactive or curable organic functional groups; and r has a value of 0, 1, 2, 3, or 4; x has a value of 0, 1 or 2; wherein in the resin m has a value of 0 to 0.95; n has a value of 0.05 to 0.95; o has a value of 0.05 to 0.95; p has a value of 0.025 to 0.5; q has a value of 0 to 0.5; and m+n+o+p+q≈1; and
  (ii) a solvent, and
(B) removing the solvent and curing the silsesquioxane resin to form an antireflective coating on the electronic device;
(C) forming a film of resist composition on top of the antireflective coating;
(D) imagewise exposing the resist film to radiation to produce an exposed film;
(E) developing the exposed film to produce an image; and
(F) etching the image into the antireflective coating.

47. A resin produced by the method comprising reacting water, $HSiX_3$, $MeSiX_3$, $RSiX_3$, and optionally $Ph(CH_2)_rSiX_3$ and/or $R^1SiX_3$ in an organic solvent, where X is a hydrolyzable group.

48. The resin as claimed in claim 47 wherein the silane $RSiX_3$ is produced in situ.

* * * * *